(12) United States Patent
Lee

(10) Patent No.: US 11,827,977 B2
(45) Date of Patent: Nov. 28, 2023

(54) LAMINAR FLOW MOCVD APPARATUS FOR III-NITRIDE FILMS

(71) Applicant: INNOSCIENCE (SUZHOU) TECHNOLOGY CO., LTD., Suzhou (CN)

(72) Inventor: Kye Jin Lee, Suzhou (CN)

(73) Assignee: INNOSCIENCE (SUZHOU) TECHNOLOGY CO., LTD., Suzhou (CN)

(*) Notice: Subject to any disclaimer, the term of this patent is extended or adjusted under 35 U.S.C. 154(b) by 371 days.

(21) Appl. No.: 17/417,393

(22) PCT Filed: Apr. 19, 2021

(86) PCT No.: PCT/CN2021/088191
§ 371 (c)(1),
(2) Date: Jun. 23, 2021

(87) PCT Pub. No.: WO2022/222000
PCT Pub. Date: Oct. 27, 2022

(65) Prior Publication Data
US 2023/0070825 A1 Mar. 9, 2023

(51) Int. Cl.
C23C 16/30 (2006.01)
C23C 16/455 (2006.01)
C23C 16/458 (2006.01)

(52) U.S. Cl.
CPC ........ *C23C 16/303* (2013.01); *C23C 16/4584* (2013.01); *C23C 16/45504* (2013.01)

(58) Field of Classification Search
CPC . C30B 25/10; C23C 16/303; C23C 16/45504; C23C 16/4584
See application file for complete search history.

(56) References Cited

U.S. PATENT DOCUMENTS 4,979,465 A * 12/1990 Yoshino ............ C23C 16/45514
118/725
5,118,642 A * 6/1992 Yoshino .................. C30B 25/14
117/102

(Continued)

FOREIGN PATENT DOCUMENTS

CN 102639761 A 8/2012
CN 109890999 A 6/2019

(Continued)

OTHER PUBLICATIONS

International Search Report and Written Opinion of the corresponding PCT application No. PCT/CN2021/088191 dated Jan. 25, 2022.

*Primary Examiner* — Robert M Kunemund
(74) *Attorney, Agent, or Firm* — JCIPRNET

(57) ABSTRACT

A CVD apparatus for manufacturing a III-nitride-based layer having a rotating wafer carrier positioned inside a reaction chamber that receives a mixture of a nitrogen gas source and a group III element gas source. Recesses are formed within the wafer carrier, each including a satellite disc of thickness x for accepting a wafer of thickness t. The satellite disc includes a peripheral notch of height a, and a notch thickness of $x-a=b$. A peripheral retaining ring includes a vertical rise portion extending a distance of $e+f$ and a laterally-extending portion, the laterally-extending portion engaging the satellite disc notch. A gap c is formed between the substrate and a surface of the satellite disc. The relationship of $a+b+c+t=b+e+f$ is satisfied such that laminar flow occurs in the region of the retaining ring.

18 Claims, 9 Drawing Sheets

(56) References Cited

U.S. PATENT DOCUMENTS

| | | | | |
|---|---|---|---|---|
| 2001/0047764 A1* | 12/2001 | Cook | ................ | H01L 21/67757 |
| | | | | 118/730 |
| 2003/0168174 A1* | 9/2003 | Foree | ..................... | C30B 25/12 |
| | | | | 118/728 |
| 2005/0011459 A1* | 1/2005 | Liu | ...................... | C30B 29/403 |
| | | | | 118/728 |
| 2010/0236483 A1* | 9/2010 | Liu | ................... | C23C 16/45589 |
| | | | | 118/730 |
| 2011/0083602 A1* | 4/2011 | Bergmann | ........ | H01L 21/68764 |
| | | | | 269/57 |

FOREIGN PATENT DOCUMENTS

| | | | |
|---|---|---|---|
| FR | 2979637 | * | 3/2013 |
| FR | 2979639 | * | 3/2013 |
| WO | 2009075747 A1 | | 6/2009 |

* cited by examiner

LAMINAR FLOW MOCVD APPARATUS FOR III-NITRIDE FILMS

FIELD OF THE INVENTION

The present invention generally relates to MOCVD apparatus for fabricating III-nitride semiconductor films. More specifically, the present invention relates to MOCVD apparatus for forming III-nitride films with improved laminar flow resulting in films with enhanced uniformity and fewer defects.

BACKGROUND OF THE INVENTION

III-nitride semiconductor films are used in numerous semiconductor and optoelectronic devices, including transistors such as high electron mobility transistors (HEMTs), light emitting diodes (LEDs), and lasers. As used herein, the term "III-nitride" means films of GaN, AlN, InN and various mixtures thereof such as AlGaN, InAlGaN and InAlN with various ratios of metal elements in the nitrides.

Metal-organic chemical vapor deposition, MOCVD, is frequently used to deposit III-nitride films onto heated substrates. In MOCVD, various reactant and, optionally, carrier gases are mixed together to create a III-nitride reaction product that is deposited onto the surface of a substrate. A source gas for the Group III element component is typically a metalorganic species that includes the Group III element bound to one or more organic materials.

In commercial-scale production environments, large substrate wafers may be used to support growth of multiple layers of III-nitride materials. It is difficult to maintain controlled reactions across the surface of large wafers (which may be up to 10 centimeters in diameter). For example, wafer supports may create thermal irregularities, locally changing the deposition rate and resulting in non-uniformly deposited films. Further, point wafer supports may scratch or otherwise damage substrate wafers. Other wafer-holding devices can cause localized turbulence in gaseous reactant flow conditions, deleteriously impacting uniform film growth. These factors that negatively impact uniform film growth are magnified when forming epitaxial semiconductor films as localized irregularities may result in dislocations causing slip (that is, the displacement of a section of the epitaxial film relative to another section of the epitaxial film). These defects will result in faulty devices and decrease the fabrication yield.

Thus, there is a need in the art for MOCVD apparatus that improve deposited III-nitride film uniformity.

SUMMARY OF THE INVENTION

The present invention provides a chemical vapor deposition apparatus that increases the uniformity of deposited III-nitride films by improving the reactant flow conditions in the region of a wafer-retention device, promoting laminar flow.

In particular, the present invention provides a chemical vapor deposition apparatus for manufacturing a nitride-based semiconductor layer on a substrate that includes a reaction chamber and a vacuum pump communicating with the reaction chamber. A nitrogen gas source inlet and a group III element gas source inlet extend into the reaction chamber. These may be the same inlet pipe, separate inlet pipes, concentric or multiple concentric inlet pipes or may be introduced through a plenum. A rotating wafer carrier positioned inside the reaction chamber receives a mixture of the nitrogen gas source and the group III element gas source; and includes one or more heaters positioned within or beneath the rotating wafer carrier.

A plurality of recesses is formed within the rotating wafer carrier; each of the recesses includes a satellite disc configured to accept a substrate wafer of thickness t. A peripheral retaining ring cooperates with the satellite disc to maintain the substrate wafer within a recess within the rotating wafer carrier.

The satellite disc has a thickness of x and includes a peripheral notch having a vertical notch height of a, the notch extending to a thickness of x−a=b. The peripheral retaining ring includes a vertical rise portion and a laterally-extending portion, the laterally-extending portion engaging the satellite disc notch, the vertical rise portion extending a distance of e+f. A gap c is formed between the substrate and a surface of the satellite disc.

The satellite disc, the gap, the substrate wafer thickness, and the peripheral ring satisfy the relationship of $a+b+c+t=b+e+f$ such that laminar flow of the nitrogen source gas and the group III element source gas occurs in the region of the substrate wafer during deposition of a group III nitride semiconductor layer.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

Embodiments of the invention are described in more detail hereinafter with reference to the drawings, in which.

DETAILED DESCRIPTION

Figure 1:
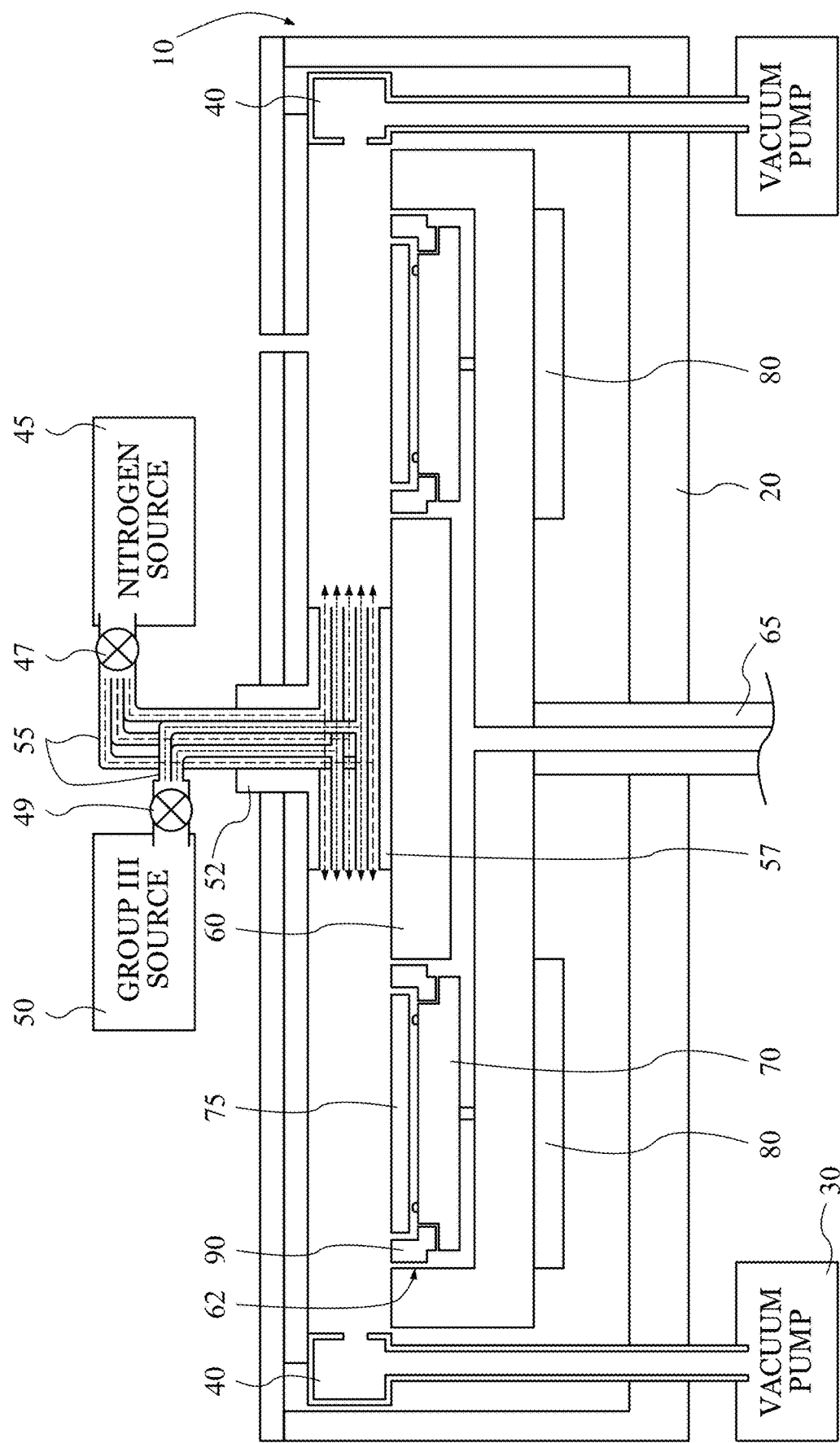
FIG. 1 is a schematic cross-sectional side view of a reactor according to an embodiment.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

In the following description, chemical vapor deposition apparatus, methods for manufacturing semiconductor layers using the chemical vapor deposition apparatus, and the like are set forth as preferred examples. It will be apparent to those skilled in the art that modifications, including additions and/or substitutions may be made without departing from the scope and spirit of the invention. Specific details may be omitted so as not to obscure the invention; however, the disclosure is written to enable one skilled in the art to practice the teachings herein without undue experimentation.

FIG. 1 schematically depicts a chemical vapor deposition apparatus 10 that may be used to perform MOCVD (metal organic chemical vapor deposition. In particular, the apparatus of FIG. 1 is configured to make HI-nitride semiconductor layers such as GaN, AlN, InN, and mixtures thereof such as AlGaN, InAlGaN, and InAlN. The apparatus 10 includes a reaction chamber 20 which is typically a vacuum chamber that includes a vacuum system including one or more vacuum pumps 30. The vacuum pump includes exhaust passages 40 through which air is evacuated (during vacuum pump-down) and waste gas during film deposition. For atmospheric pressure CVD, the vacuum pump may be used to assist with exhausting gas without drawing a vacuum in the reaction chamber 20.

To deposit HI-nitride films, a nitrogen source 45 such as nitrogen, ammonia, or other nitrogen-containing gases is provided along with one or more Group III sources such as indium, gallium, or aluminum, 50. Exemplary Group III sources include organometallic gases such as trimethyl indium, trimethyl gallium, or trimethyl aluminum. For p-type dopants such as magnesium, bis-cyclopentadienyl magnesium (Cp2Mg) may be used. For n-type dopants such as silicon, silane and disilane may be used. Optionally, carrier gases such as hydrogen or nitrogen may be provided for the organometallic gases. Depending upon the selected reactants, an organometallic gas may decompose upon being heated into an intermediate produce. This intermediate product will react with the nitrogen source gas (such as ammonia) and form a HI-nitride layer on the substrate. Additional gases may be added for dopants that are introduced during the film formation process (e.g., sources for dopants such as iron, boron, fluorine, etc.). However, it is understood that these gases are only examples and that the apparatus of the present invention may be used with any kind of chemical vapor deposition reactants.

The gases for chemical vapor deposition may enter through a gas inlet system 52. In one embodiment, the inlet system may be a single gas inlet; alternatively, two or more gas inlets may be provided. When using two or more gas inlets, a concentric gas inlet 55 may be used. In the concentric embodiment depicted, a nitrogen source may enter through a central inlet with the organometallic precursor gas flowing in the outer pipe; alternatively, the sources may be switched. When using a large number of different source gases and carrier gasses, one or more gas manifolds may optionally be included; all of the different source gases and carrier gasses are connected to the manifold with various gas combinations used for each sequential deposition process. As seen in FIG. 1, a five-inlet system 55 may be used. The nitrogen source and organometallic source are interspersed as seen in FIG. 1. Gas controllers 47 and 49 are provided for precise flow regulation of the reactants. Multiple controllers may be used for each inlet or one controller for multiple inlets; as shown.

A plenum 57 may be optionally provided to ensure even distribution of reaction gases such as a shower plenum; however various gas distribution techniques may be used including remote gas mixing techniques, remote plasma generation when desiring to use charged species, and numerous types of gas introduction devices into the reaction chamber depending upon the desired flow conditions. In some embodiments two plenums 57 may be used with one plenum for the nitrogen source gas and one plenum for the III-source gas. Alternatively, reactant gases may be injected through the sides of the reaction chamber for enhancing laminar flow within the reaction chamber. Further, the reactor may optionally include plasma generating electrodes when performing plasma-enhanced chemical vapor deposition. These can be associated with the plenum for activating the reactive species upon entry into the reaction chamber. As seen in FIG. 1, a penta-injection system 57 may be used in which three nitrogen source and two organometallic source inlets are interspersed (or, alternatively, three organometallic and two nitrogen source inlets)

A rotating wafer carrier 60 is supported on rotating shaft 65 to ensure uniform film deposition. When the reaction chamber 20 is approximately cylindrical in shape, the wafer carrier 60 is approximately circular in shape. The wafer carrier may be made of metal, such as stainless steel or molybdenum or, alternatively, out of graphite. Various thermally-resistant coatings may be provided on the wafer carrier including carbides such as silicon carbide and tungsten carbide. For high temperature processes, the wafer carrier includes one or more heaters 80 which may be positioned within the wafer carrier, adjacent to the wafer carrier, or on the bottom surface of the wafer carrier. Heater(s) 80 may be a resistive heater, inductive heater, radiant heater or any other heating element capable of proving sufficient energy to perform reactions up to approximately 1300° C. Rotating shaft 65 extends outside of the reaction chamber and is connected to a variable drive mechanism (not shown) that permits selection of rotation speed.

The wafer carrier 60 is provided with a plurality of recesses 62 formed in the wafer carrier surface. Each of the recesses 62 includes a satellite disc 70 for holding a substrate wafer 75, The satellite disc is configured for wafer support and is optionally rotatable; it is optionally fabricated from a material with good thermal conduction properties such as silicon carbide (SiC) and graphite coated by SiC. The wafer is retained by a peripheral retaining ring 90, Several mechanisms may be used to rotate the satellite disc 70 within the wafer carrier recess 62. The satellite disc may be mounted on a spindle or other axis for rotation (as shown); alternatively, a space between the wafer carrier recess 62 and the satellite disc 70 may be filled with an inert gas that is used to rotate the satellite disc 70 (not shown). The relationship among rotatable wafer carrier 60, recess 62, satellite disc 70, substrate wafer 75 and peripheral retaining ring 90 is described in further detail in the enlarged view of FIGS. 3A-3C, below.

Figure 2:
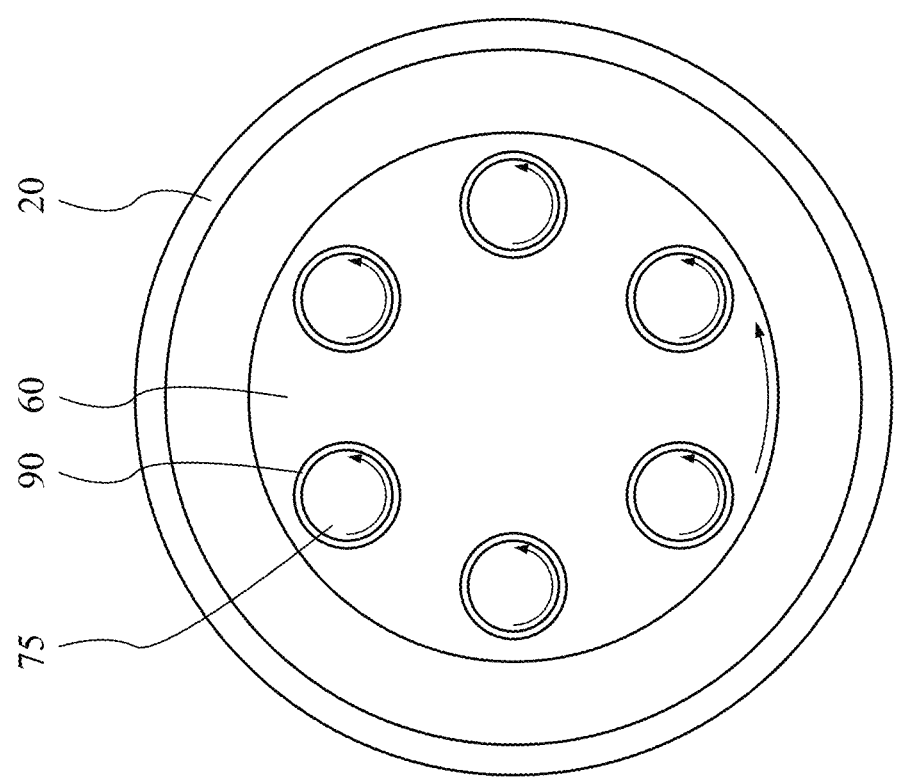
FIG. 2 is a top view showing the rotation of the substrate wafers and the wafer carrier.

FIG. 2 is a top view of the wafer carrier 60 and substrate wafers 75 retained by peripheral retaining ring 90 showing the directions of rotation in an embodiment. The substrate wafers and the wafer carrier optionally rotate in the same direction, as shown although they are capable of rotating in the opposite direction as well.

Figure 3A:
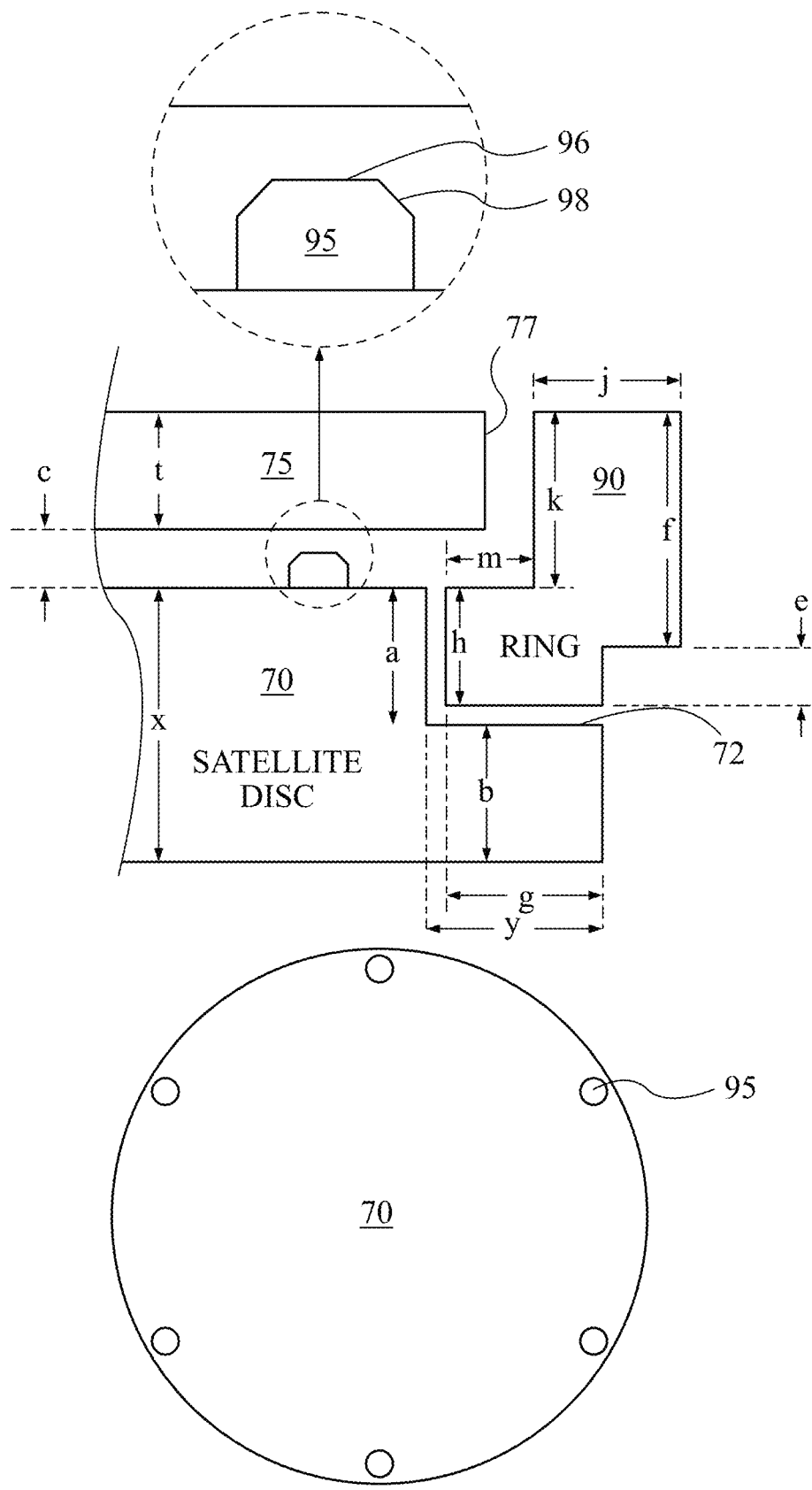
FIGS. 3A-3C show the relationship among the substrate wafer, the satellite disc, the wafer carrier, and the peripheral retaining ring.
Figure 3B:
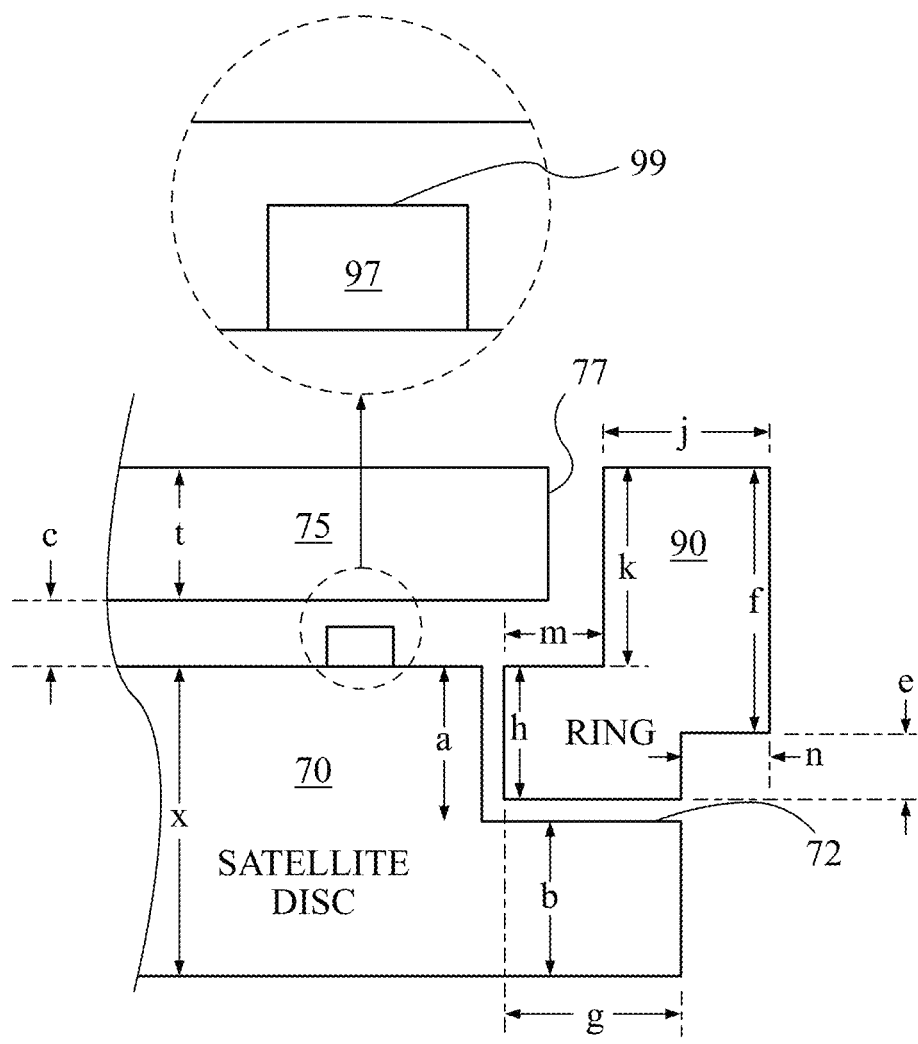
Figure 3B:
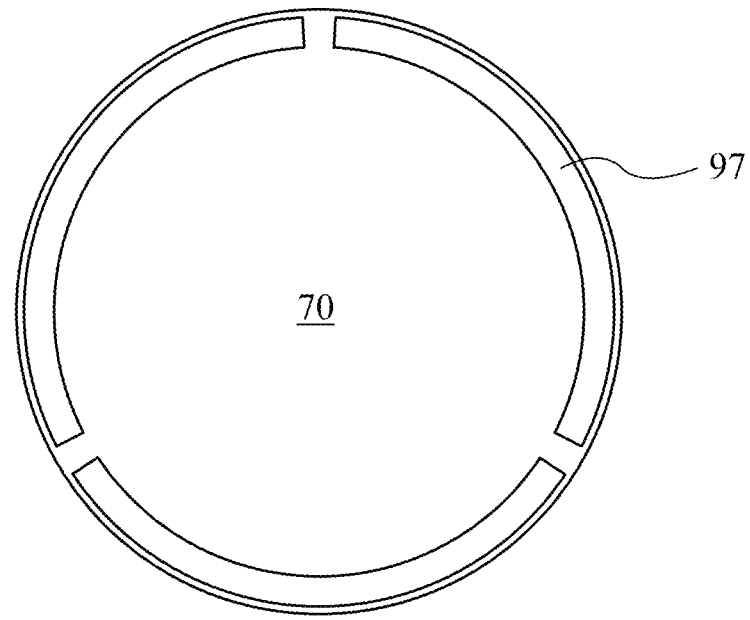
Figure 3C:
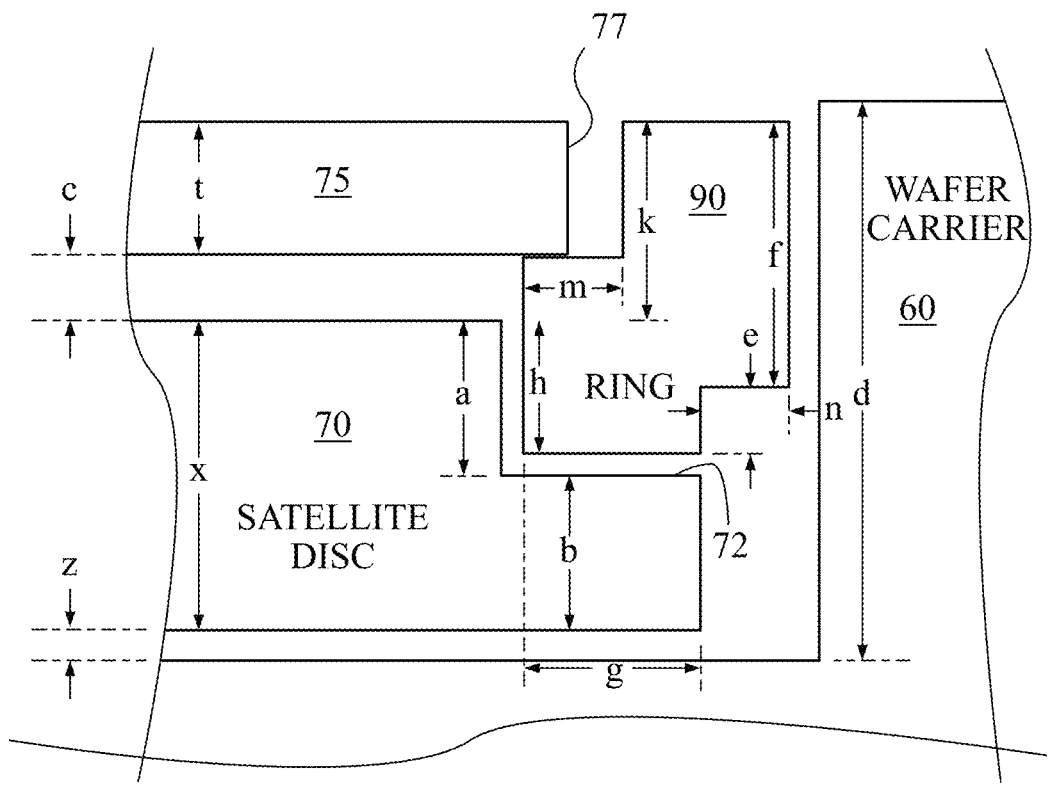
Figure 3C:
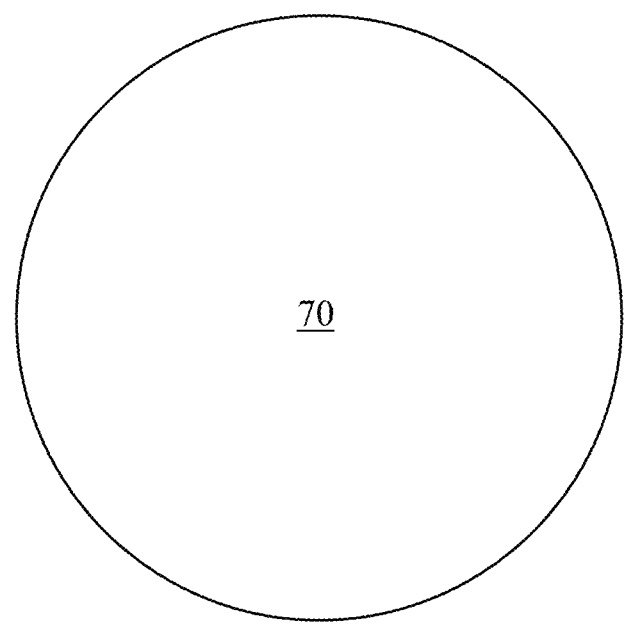

FIGS. 3A-3C depict several embodiments of the satellite disc 70 and peripheral retaining ring 90 and their relationship to the water carrier 60 and optional substrate supports. FIG. 3A depicts a cross-sectional side view of the satellite disc 70, the peripheral retaining ring 90, and substrate 75 along with optional wafer supports 95. The satellite disc has an overall disc thickness of x with an edge notch/peripheral groove having a laterally-extending portion y and a height of a. The notch thickness is x−a=b.

The peripheral retaining ring 90 has a reciprocal notch for engaging with the satellite disc and the substrate wafer 75. The notch has a height of distance k and a laterally extending portion of distance m. Optionally, the peripheral retaining ring 90 includes a second notch having a notch height of e and a notch length of n. Rising from the second notch is vertical rise portion f. Thus, the total height of the peripheral retaining ring is e+f. However, in some embodiments, the distance e+f may be a continuous edge without the notched-out portion of e and n.

Extending beyond the second notch in the peripheral retaining ring is laterally-extending portion g, the laterally-extending portion engaging the satellite disc notch along surface y. That is, the length of the laterally-extending portion g of the peripheral retaining ring 90 is less than the length of the laterally-extending portion y of the satellite disc. The total vertical height of the peripheral retaining ring is e+f or, alternatively, h+k.

A gap c exists between the wafer substrate 75 and a surface of the satellite disc 70. In the embodiment of FIG. 3A, the gap is filled by plural wafer supports 95. The supports 95 may extend from the surface of the satellite disc 70 a distance of c. To prevent thermal stresses and to prevent substrate damage, the support 95 includes a planar surface 96 that is approximately parallel to the surface of the satellite disc 70 and the rear surface of substrate wafer 75. Optionally the edges of substrate support 95 may be beveled edges 98. The supports may be positioned approximately equidistantly near the perimeter of the satellite disc; as shown in FIG. 3A, a total of six substrate supports 95 are provided. More or fewer substrate supports may be provided depending upon the size of substrate wafer 75.

In order to maintain laminar flow in the region of the substrate wafer edge 77/peripheral retaining ring 90/wafer carrier recess edge 62, the total height of the satellite disc, the thickness of the substrate wafer, and the gap thickness between the satellite disc and the rear surface of the substrate wafer are equal to the total height of the retaining ring plus the notch height of the satellite disc. Both of these totals should match a depth d of recess 62 of the wafer carrier 60 minus any distance z between the satellite disc and the bottom of recess 62. That is, the relationship of a+b+c+t=b+e+f is satisfied such that laminar flow occurs in the region of the retaining ring. Further, the above equation is equal to d−z such that the various surfaces are approximately level with the surface of the wafer carrier 60.

FIG. 3B depicts a further embodiment with a cross-sectional side view of the satellite disc 70, the peripheral retaining ring 90, and substrate 75 along with optional wafer supports 97. In this embodiment, wafer supports 97 form a continuous or semi-continuous support surface 99 near the satellite disc periphery as seen in the top view in FIG. 3B. In this embodiment, the support surface extends along at least 70 percent of the circumference of the satellite disc, preferably more than 80 percent or more than 90 percent. The support surface 99 is substantially parallel to the surface of the satellite disc 70. In the embodiment of FIG. 3B, there is additional amelioration of thermal stress due to increased contact between the substrate wafer and the support.

In the embodiment of FIG. 3C a separate wafer support is not used in gap c and, instead, the retaining ring 90 is reconfigured to have a greater first notch height h such that the peripheral ring first notch supports the substrate wafer 75. The peripheral retaining ring 90 may be made of graphite or silicon carbide in order to provide good thermal transfer properties. Alternatively, ring 90 may be made of stainless steel or molybdenum.

Figure 4A:
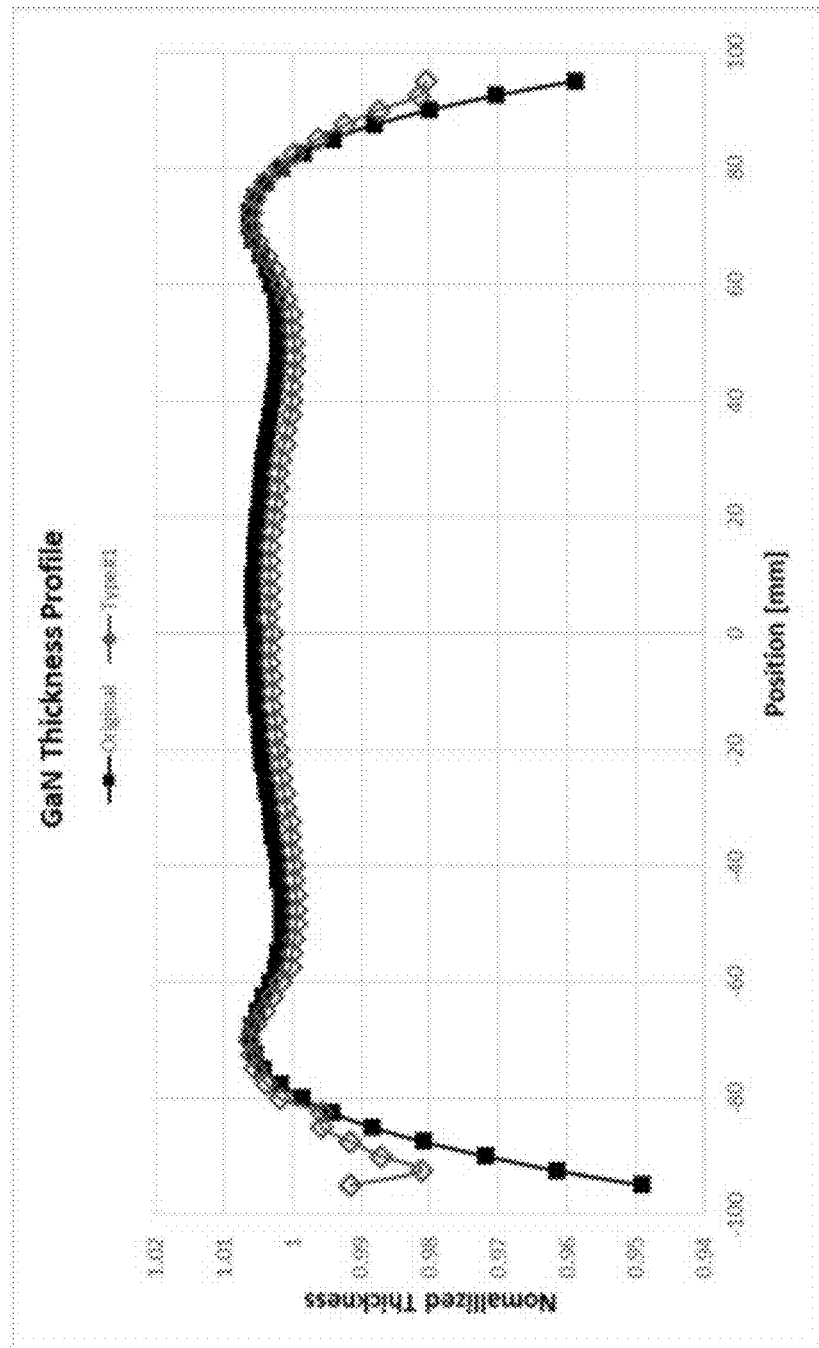
FIGS. 4A-4C depicts the thickness profiles of a GaN film using the reactor of FIG. 1.
Figure 4B:
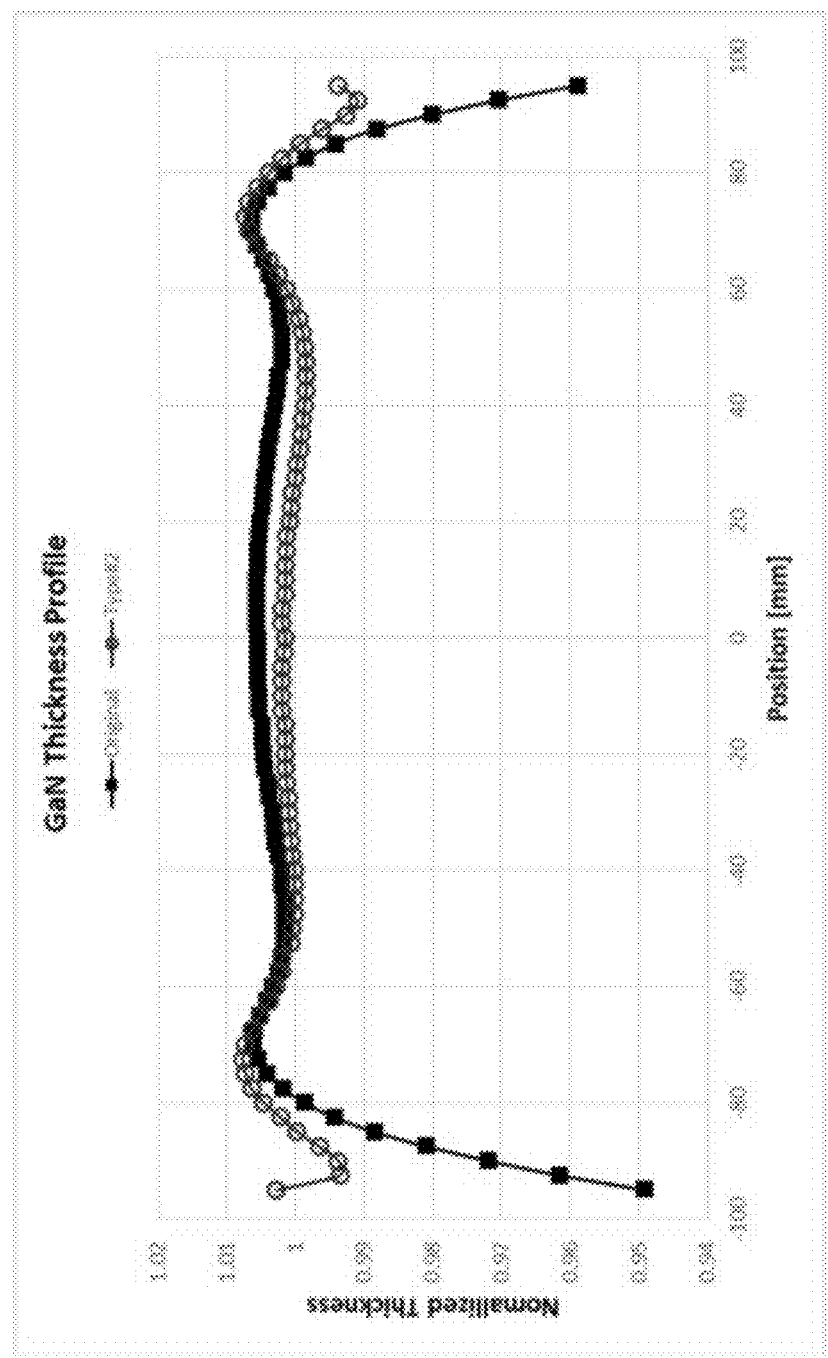
Figure 4C:
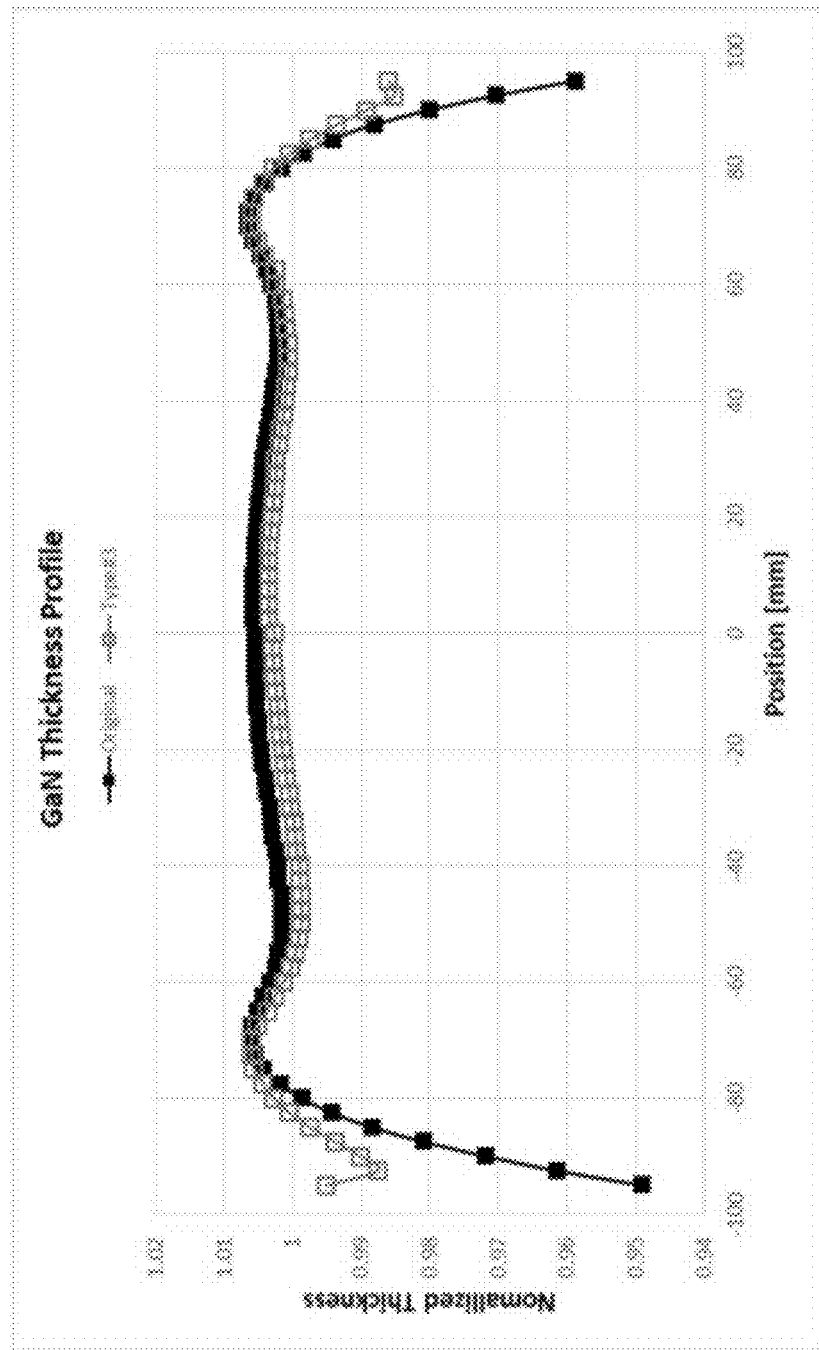

FIGS. 4A-4C depicts the formation of a gallium nitride layer on substrate 75 using the MOCVD reactor of the present invention. FIG. 4A depicts a GaN profile from a conventional MOCVD apparatus compared to the profile from a GaN film using the configuration shown in FIG. 3A; FIG. 4B compares to the profile made using FIG. 3B, and FIG. 4C compares to the profile made using FIG. 3C. respectively. As seen in FIGS. 4A-4C, the film thickness profiles are more uniform for films formed using the MOCVD reactor of the present invention.

Figure 5:
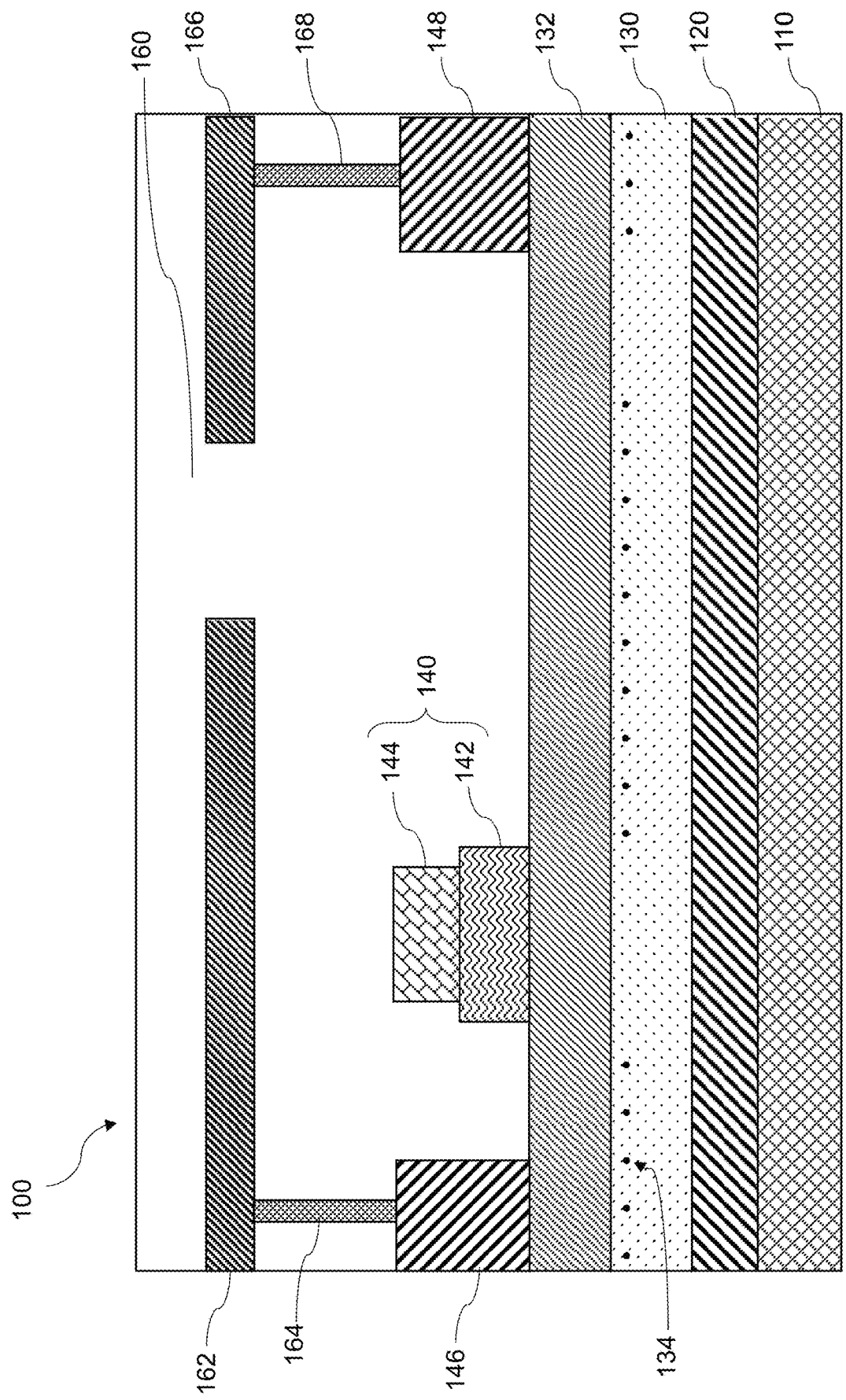
FIG. 5 is a cross-sectional view of a semiconductor device made using the reactor of FIG. 1.

The MOCVD reactor of the present invention may be used to make a variety of devices, as described above. An exemplary device that may have its III-nitride layers formed in the reactor of the present invention is a III-nitride high electron mobility transistor 100 as depicted in FIG. 5 is a cross-sectional view of a semiconductor device 100 according to some embodiments of a present disclosure. The semiconductor device 100 includes a substrate 110, a buffer layer 120, a semiconductor layer 130, a semiconductor layer 132, a gate structure 140, a source 146, a drain 148.

The exemplary material of substrate 110 can include, for example but is not limited to, Si, SiGe, SiC, gallium arsenide, p-doped Si, n-doped Si, sapphire, semiconductor on insulator, such as silicon on insulator (SOI), or other suitable materials including group III elements, group IV elements, group V elements, or combinations thereof. In some other embodiments, the substrate 110 can include one or more other features, such as a doped region, a buried layer, an epitaxy (epi) layer, or combination thereof.

The buffer layer 120 is disposed on the substrate 110. The exemplary material of the buffer layer 120 can include, for example but is not limited to, nitrides or group III-V compounds, such as GaN, GaAs, InN, AlN, InGaN, AlGaN, InAlGaN, or combinations thereof. The buffer layer 120 may be deposited in MOCVD reactor 10 and is provided for reducing lattice and thermal mismatches between the substrate 110 and a layer to be formed above the buffer layer 120 (e.g., epitaxially formed thereon), thereby curing defects due to the mismatches. That is, with the buffer layer 120, occurrence of dislocation and defects is reduced. The buffer layer may be a single layer or plural layers having the same or different compositions and may be the same material deposited under different conditions.

The semiconductor layer 130 is disposed on the buffer layer 120. The exemplary material of the semiconductor layer 130 can include, for example but is not limited to, nitrides or group III-V compounds, such as GaN, AlN, InN, $In_xAl_yGa_{(1-x-y)}N$ where x+y≤1, $Al_yGa_{(1-y)}N$ where y≤1. The semiconductor layer 132 is disposed on the semiconductor layer 130. The exemplary material of the semiconductor layer 132 can include, for example but is not limited to, nitrides or group III-V compounds, such as GaN, AlN, InN, $In_xAl_yGa_{(1-x-y)}N$ where x+y≤1, $Al_yGa_{(1-y)}N$ where y≤1. Layer 130 is deposited using MOCVD reactor 10.

The exemplary materials of the semiconductor layers 130 and 132 are selected such that the semiconductor layer 132 has a bandgap (i.e., forbidden band width) greater than a bandgap of the semiconductor layer 130, which causes electron affinities thereof different from each other. For example, when the semiconductor layer 130 is an undoped GaN layer having bandgap of approximately 3.4 eV, the semiconductor layer 132 may be an AlGaN layer having bandgap of approximately 4.0 eV. As such, the semiconductor layers 130 and 132 serve as a channel layer and a barrier layer, respectively. A triangular well potential is generated at a bonded interface between the channel and barrier layers, so that electrons accumulate in the triangular well potential, thereby generating a two-dimensional electron gas (2DEG) region 134 at the same interface. Accordingly, the semiconductor device 100 can serve as a high-electron-mobility transistor (HEMT).

A gate structure 140 is disposed on the semiconductor layer 132. In the present embodiment, the gate structure 140 includes a p-type doped III-V compound layer/nitride semiconductor layer 142 forming an interface with the semiconductor layer 132 and a conductive gate 144 stacked on the p-type doped III-V compound/nitride semiconductor layer 132. In other embodiments, the gate structure 140 may further include a dielectric structure (not illustrated) between the p-type doped III-V compound/nitride semiconductor layer 142 and the conductive gate 144, in which the dielectric structure can be formed by one or more layers of dielectric materials.

In the embodiment of FIG. 5 the semiconductor device 100 is an enhancement mode device, which is in a normally-off state when the conductive gate 144 is at approximately zero bias. Specifically, the p-type doped III-V compound/nitride semiconductor layer 142 creates a p-n junction with the semiconductor layer 132 to deplete the 2DEG region 134, such that a zone of the 2DEG region 134 corresponding to a position below the gate structure 140 has different characteristics (e.g., different electron concentrations) than the rest of the 2DEG region 134 and thus is blocked.

Due to such mechanism, the semiconductor device 100A has a normally-off characteristic. In other words, when no voltage is applied to the gate 144 or a voltage applied to the gate 144 is less than a threshold voltage (i.e., a minimum voltage required to form an inversion layer below the gate structure 140), the zone of the 2DEG region 134 below the gate structure 140 is kept blocked, and thus no current flows there through. Moreover, by providing the p-type doped III-V compound/nitride semiconductor layer 142, gate leakage current is reduced and an increase in the threshold voltage during the off-state is achieved.

The exemplary material of the p-type doped III-V compound layer 142 can include, for example but is not limited to, p-doped group III-V nitride semiconductor materials, such as p-type GaN, p-type AlGaN, p-type InN, p-type AlInN, p-type InGaN, p-type AlInGaN, or combinations thereof. In some embodiments, the p-doped materials are achieved by using a p-type impurity, such as Be, Mg, Zn, Cd. In one embodiment, the semiconductor layer 130 includes undoped GaN and the semiconductor layer 132 includes AlGaN, and the p-type doped III-V compound layer 142 is a p-type GaN layer which can bend the underlying band structure upwards and to deplete the corresponding zone of the 2DEG region 134, so as to place the semiconductor device 100A into an off-state condition. Alternatively, the gate 144 may be deposited directly on the layer 132, resulting in a normally-on device.

The exemplary material of the conductive gate 144 may be metals or metal compounds including, but not limited to W, Au, Pd, Ti, Ta, Co, Ni, Pt, Mo, TiN, TaN, other metallic compounds, nitrides, oxides, silicides, doped semiconductors, metal alloys, or combinations thereof. The optional dielectric structure can include, for example but is not limited to, one or more oxide layers, a $SiO_x$ layer, a $SiN_x$ layer, a high-k dielectric material (e.g., $HfO_2$, $Al_2O_3$, $TiO_2$, $HfZrO$, $Ta_2O_3$, $HfSiO_4$, $ZrO_2$, $ZrSiO_2$, etc.), or combinations thereof.

The source 146 and the drain 148 are disposed on the semiconductor layer 132 and located at two opposite sides of the gate structure 140 (i.e., the gate structure 140 is located between the source 146 and the drain 148). In the exemplary illustration of FIG. 5, the source 146 and the drain 148 are asymmetrical about the gate structure 140, with the source 146 closer to the gate structure 140 than the drain 148. The present disclosure is not limited thereto, and the configuration of the source 146 and the drain 148 is adjustable. The exemplary materials of the source 146 and the drain 148 can include, for example but is not limited to, metals, alloys, doped semiconductor materials (such as doped crystalline silicon), other conductor materials, or combinations thereof.

Optional additional p-doped regions may be provided beneath or next to the drain electrode as disclosed in U.S. Pat. No. 10,833,159, the disclosure of which is incorporated by reference herein.

The semiconductor device 100 further includes one or more dielectric layer(s) 160 disposed on the semiconductor layer 132 and covering the gate structure 140. In some embodiments, the dielectric layer 160 serves as a passivation layer to protect the underlying elements or layers. In various embodiments, the dielectric layer 160 has a flat topmost surface, which is able to act as a flat base for carrying layers formed in a step subsequent to the formation of the dielectric layer 160. The exemplary material of the dielectric layer 160 can include, for example but is not limited to, $SiN_x$, $SiO_x$, SiON, SiC, SiBN, SiCBN, oxides, nitrides, or combinations thereof. In some embodiments, the dielectric layer 160 is a multi-layered structure, such as a composite dielectric layer of $Al_2O_3$/SiN, $Al_2O_3$/$SiO_2$, AlN/SiN, AlN/$SiO_2$, or combinations thereof.

The semiconductor device 100 further optionally includes a source field plate 162 disposed over the source 146, a first via 164 between the source field plate 162 and the source 146, a drain field plate 166 disposed over the drain 148, and a second via 168 between the drain field plate 166 and the drain 148, in which the source and drain field plates 162 and 166 are higher than the gate structure 140 with respect to the second semiconductor layer 132.

The source field plate 162 extends from a position above the source 146 to and over a position above the gate structure 140. In some embodiments, the source field plate 162 has an extending length greater than a distance from the source 146 to the gate structure 140. That is, a vertical projection of the gate structure 140 on the semiconductor layer 132 is present within a vertical projection of the source field plate 162 on the semiconductor layer 132. The first via 164 connects the source 146 and the source field plate 162, such that the source 146 and the source field plate 162 are electrically coupled with each other.

The drain field plate 166 extends from a position above the drain 148 toward the position above the gate structure 140. In some embodiments, the drain field plate 166 has an extending length less than a distance from the drain 148 to the gate structure 140. That is, a vertical projection of the gate structure 140 on the semiconductor layer 132 is out of a vertical projection of the drain field plate 166 on the semiconductor layer 132. The second via 168 connects the drain 148 and the drain field plate 166, such that the drain 148 and the drain field plate 166 are electrically coupled with each other.

These source and drain field plates 162 and 166 change an electric field distribution of the source and drain regions and affect breakdown voltage of the semiconductor device 100. In other words, the source and drain field plates 162 and 166 suppress the electric field distribution in desired regions and to reduce its peak value. The exemplary materials of the source and the drain field plates 162 and 166 can include, for example but are not limited to, metals, alloys, doped semiconductor materials (such as doped crystalline silicon), other suitable conductor materials, or combinations thereof.

The foregoing description of the present invention has been provided for the purposes of illustration and description. It is not intended to be exhaustive or to limit the invention to the precise forms disclosed. Many modifications and variations will be apparent to the practitioner skilled in the art.

The embodiments were chosen and described in order to best explain the principles of the invention and its practical application, thereby enabling others skilled in the art to understand the invention for various embodiments and with various modifications that are suited to the particular use contemplated.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 within 30 within 20 within 10 or within 1 µm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

The invention claimed is:

1. A chemical vapor deposition apparatus for manufacturing a nitride-based semiconductor layer on a substrate comprising:
   a reaction chamber;
   a vacuum pump communicating with the reaction chamber;
   one or more nitrogen gas source inlets extending into the reaction chamber;
   one or more group III element gas source inlets extending into the reaction chamber;
   a rotating wafer carrier positioned inside the reaction chamber to receive a mixture of the nitrogen gas source and the group III element gas source;
   one or more heaters positioned within or beneath the rotating wafer carrier;
   a plurality of recesses formed within the rotating wafer carrier, each of the recesses including:
      a rotating satellite disc configured to accept a substrate wafer of thickness t;
      a peripheral retaining ring cooperating with the rotating satellite disc to maintain the substrate wafer within a recess within the rotating wafter carrier;
      the rotating satellite disc having a thickness of x and a peripheral notch having a vertical notch height of a, the notch extending to a notch thickness of $x-a=b$;
      the peripheral retaining ring includes a vertical rise portion and a laterally extending portion, the laterally extending portion engaging the rotating satellite disc notch, the vertical rise portion extending a distance of $e+f$;
      a gap c between the substrate and a surface of the rotating satellite disc;
      the rotating satellite disc, the gap, the substrate wafer thickness, and the peripheral ring satisfying the relationship of $a+b+c+t=b+e+f$ such that laminar flow of the nitrogen source gas and the group III element source gas occurs in the region of the substrate wafer during deposition of a group III nitride semiconductor layer.

2. The chemical vapor deposition apparatus of claim 1, wherein the gap includes a substrate wafer support having a height of c.

3. The chemical vapor deposition apparatus of claim 2, wherein the substrate wafer support has a substrate wafer-contacting surface that is approximately planar and approximately parallel to a surface of the rotating satellite disc.

4. The chemical vapor deposition apparatus of claim 3, wherein the substrate wafer support is a plurality of individual substrate wafer supports extending vertically from a surface of the rotating satellite disc adjacent to the periphery of the rotating satellite disc.

5. The chemical vapor deposition apparatus of claim 4, wherein the plurality of individual substrate wafer supports includes at least six individual substrate wafer supports spaced approximately equidistantly apart.

6. The chemical vapor deposition apparatus of claim 3, wherein the substrate wafer support has a continuous or semi-continuous support surface extending along at least 70 percent of the circumference of the satellite disc.

7. The chemical vapor deposition apparatus of claim 3, wherein the substrate wafer support includes beveled edges leading away from the approximately planar substrate wafer-contacting surface.

8. The chemical vapor deposition apparatus of claim 1, wherein the peripheral retaining ring includes a notch configured to receive and support the substrate wafer.

9. The chemical vapor deposition apparatus of claim 8, wherein the peripheral retaining ring notch has a laterally-extending portion and a vertically-extending portion, the notch laterally-extending portion engaging a laterally-extending portion of the rotating satellite disc notch.

10. The chemical vapor deposition apparatus of claim 1, wherein each recess of the plurality of recesses has a depth of d and a distance between the satellite disc and a base of the recess is z, wherein the "they" depth of the recess d=b+e+f of the satellite disc and the peripheral retaining ring.

11. The chemical vapor deposition apparatus of claim 1, wherein the rotating satellite disc is rotated by a gas.

12. The chemical vapor deposition apparatus of claim 1, wherein the rotating satellite disc is rotated by a spindle.

13. The chemical vapor deposition apparatus of claim 1, further comprising a gas-introduction plenum communicating with the one or more nitrogen gas source inlets and the one or more group III element gas source inlets.

14. The chemical vapor deposition apparatus of claim 13, wherein the gas-introduction plenum has plural side openings for introducing a gas flow parallel to the satellite disc.

15. The chemical vapor deposition apparatus of claim 14, wherein the plural side openings include at least five openings.

16. The chemical vapor deposition apparatus of claim 1, wherein the rotating satellite disc rotates in a same direction as the rotating wafer carrier.

17. The chemical vapor deposition apparatus of claim 1, wherein the rotating satellite disc comprises silicon carbide.

18. The chemical vapor deposition apparatus of claim 1, wherein the rotating satellite disc comprises graphite coated with silicon carbide.

* * * * *